United States Patent [19]
Park et al.

[11] Patent Number: 5,732,032
[45] Date of Patent: Mar. 24, 1998

[54] SEMICONDUCTOR MEMORY DEVICE HAVING A BURN-IN CONTROL CIRCUIT AND BURN-IN TEST METHOD THEREOF

[75] Inventors: Hee-Choul Park; Kook-Hwan Kwon, both of Kyungki-do, Rep. of Korea

[73] Assignee: Samsung Electronics Co., Ltd., Suwon, Rep. of Korea

[21] Appl. No.: 715,549

[22] Filed: Sep. 19, 1996

[30] Foreign Application Priority Data

Sep. 19, 1995 [KR] Rep. of Korea .................. 30735/1995

[51] Int. Cl.⁶ .................................................. G11C 29/00
[52] U.S. Cl. ............................................ 365/201; 365/194
[58] Field of Search ............................... 365/201, 194, 365/203, 230.06

[56] References Cited

U.S. PATENT DOCUMENTS

| | | | |
|---|---|---|---|
| 5,452,253 | 9/1995 | Choi | 365/201 |
| 5,471,429 | 11/1995 | Lee et al. | 365/201 |
| 5,541,883 | 7/1996 | Devanney | 365/201 |

*Primary Examiner*—Do Hyun Yoo
*Attorney, Agent, or Firm*—Marger, Johnson, McCollom & Stolowitz, P.C.

[57] ABSTRACT

A burn-in test circuit for a semiconductor memory device tests for defective memory cells. The test circuit applies a test signal that turns "off" transistors in a precharge circuit and applies a select signal to memory cells at predetermined intervals. The select signal and test signal are delayed for different time intervals depending on whether the memory device is transitioning from a normal operating mode to a test mode or from the test mode to the normal operating mode. The selective delay prevents overcurrent conditions from occurring during the mode transitions.

11 Claims, 3 Drawing Sheets

SEMICONDUCTOR MEMORY DEVICE HAVING A BURN-IN CONTROL CIRCUIT AND BURN-IN TEST METHOD THEREOF

BACKGROUND OF THE INVENTION

1. Field of the Invention

The present invention relates to a semiconductor memory device and more particularly to a semiconductor memory device including burn-in test circuitry. The present application is based upon Korean Application No. 30735/1995 which is incorporated herein by reference.

2. Description of the Related Art

Recently, with the development of high density semiconductor memory devices, methods and programs have been studied for reducing required device test time. To reduce test time, various burn-in circuits and methods have been developed.

FIG. 1 is a circuit diagram used for testing the defective conditions of memory cells in a conventional semiconductor memory device. Referring to FIG. 1, a plurality of cells 106 store data. A plurality of bit line pairs BL and BLB are connected to the left and right sides of the cells 106, respectively and a plurality of word lines WL1 to WL8 are connected to upper and lower sides of the cells 106.

A precharge circuit 104 includes PMOS transistors 105A and 105B and is connected to a first terminal on each of the bit line pairs BL and BLB. A column pass circuit 107 includes transmission gates connected to a second terminal on each of the bit line pairs BL and BLB. Write drivers 110 and 111 are connected to the output terminals on the column pass circuit and perform write operations. A row decoder 102 applies a row signal to the cells 106 through the word lines WL1 to WL8 and a column decoder 103 applies column signals Y to the column pass circuit 107.

A burn-in control circuit 100 applies a burn-in control signal BI to the precharge circuit 104. The signal BI is delayed forming the signal BI' before reaching the precharge circuit 104. A complementary burn-in control signal BIB (which is inverted by an inverter 101) is applied to the row decoder 102 and a column decoder 103. The above-mentioned cells 106 are typically 8-bit cells or 16-bit cells. The PMOS transistors 105A and 105B are called "clamp transistors", hereinafter.

FIG. 2 is a timing diagram of the burn-in control signals in FIG. 1. Referring to FIGS. 1 and 2, the burn-in control circuit 100 is in a normal mode when the output BI and accordingly BI' are in a logic "low" level. The burn-in control circuit 100 is in a burn-in mode when the burn-in control signal BI and BI' are in a logic "high" level.

When the burn-in control signal BI' is in a logic "high level", two or more row signals WL1~WL8 or column signals Y are concurrently selected, and the plurality of cells are enabled for a given time. Simultaneously selecting a plurality of cells 106 reduces the required burn-in time and achieves a high burn-in effect. If many column signals are enabled when the plurality of cells 106 are selected, a high current passes through the clamp transistors 105A and 105B in the precharge circuit 104 to the bit lines BL and BLB. The high current flows to the cells 106 and the write drivers 110 and 111, affecting the device.

To protect the device, the burn-in mode is entered. During the burnin mode, the burn-in control signal BI is in the logic "high" level and the clamp transistors 105A and 105B are turned "off", thereby preventing current from flowing.

The delay in BI' causes the row signals WL1~WL8 or column signal Y to become enabled before the clamp transistors 105A and 105B are turned "off". During transitions to normal mode (BI'=logic "low" level), the clamp transistors 105A and 105B are turned "on" while the burn-in control signal BIB is still in the logic "low" level. Since the row signals WL1~WL8 and column signal Y remain in the burn-in mode, a high current flows through the clamp transistors 105A and 105B and the write drivers 110 and 111. In other words, the burn-in control signal BI' and the complementary burn-in control signal BIB are enabled at the same time for intervals T1 and T2. The simultaneous enablement of BI' and BIB generates overcurrent flow.

SUMMARY OF THE INVENTION

Therefore, it is an object of the present invention to provide a semiconductor memory device burn-in test circuit that prevents overcurrent flow when changing between a burn-in mode and a normal mode.

A burn-in test circuit according to the invention applies a test signal that determines the defective status of memory cells in a memory circuit. The test circuit applies a signal that selects memory cells and enables a precharge circuit at predetermined time intervals that ensure no overcurrent conditions occur in the memory device while transitioning between normal and burn-in test modes.

BRIEF DESCRIPTION OF THE DRAWINGS

A more complete appreciation of this invention, and many of the advantages thereof, will be readily apparent by reference to the following detailed description when considered in conjunction with the accompanying drawings.

DETAILED DESCRIPTION OF THE PREFERRED EMBODIMENT

Figure 3:
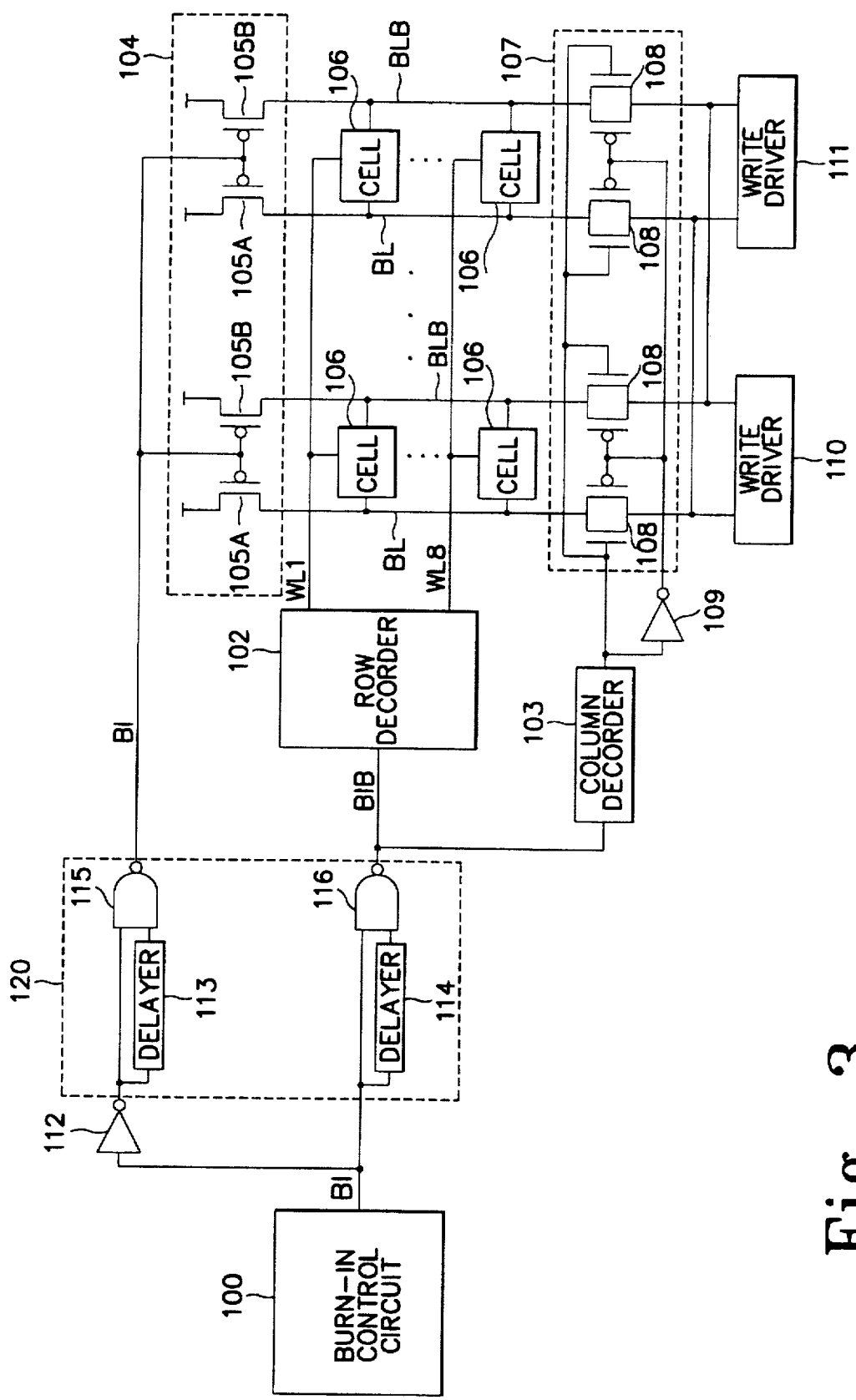
FIG. 3 is a schematic circuit diagram of a burn-in test circuit according to the present invention.

FIG. 3 is a circuit diagram for testing memory cells according to the present invention. A control circuit 120 is connected between the burn-in control circuit 100 and the precharge circuit 104 and the row and column decoders 102 and 103. The control circuit 120 performs a delay operation during transitions between a burn-in mode and a normal mode.

The control circuit 120 includes a first controller which is connected between the burn-in control circuit 100 and the precharge circuit 104. The first controller generates the burn-in control signal BI' which is delayed in relation to the burn-in control signal BI output from the burn-in control circuit 100.

A second controller is connected between the burn-in control circuit 100 and the row and column decoders 102 and 103. The second controller generates the complementary burn-in control signal BIB in response to the burn-in control signal BI output from the burn-in control circuit 100.

The first controller includes a NAND gate 115 having a first input terminal receiving the burn-in control signal BI through an inverter 112. A second input terminal receives a delayed burn-in control signal BI from inverter 112 through a first delay circuit 113.

The second controller includes a NAND gate 116 having a first input terminal coupled to the burn-in control signal BI and a second input terminal coupled through a second delay circuit 114 to the burn-in control signal BI.

Figure 1:
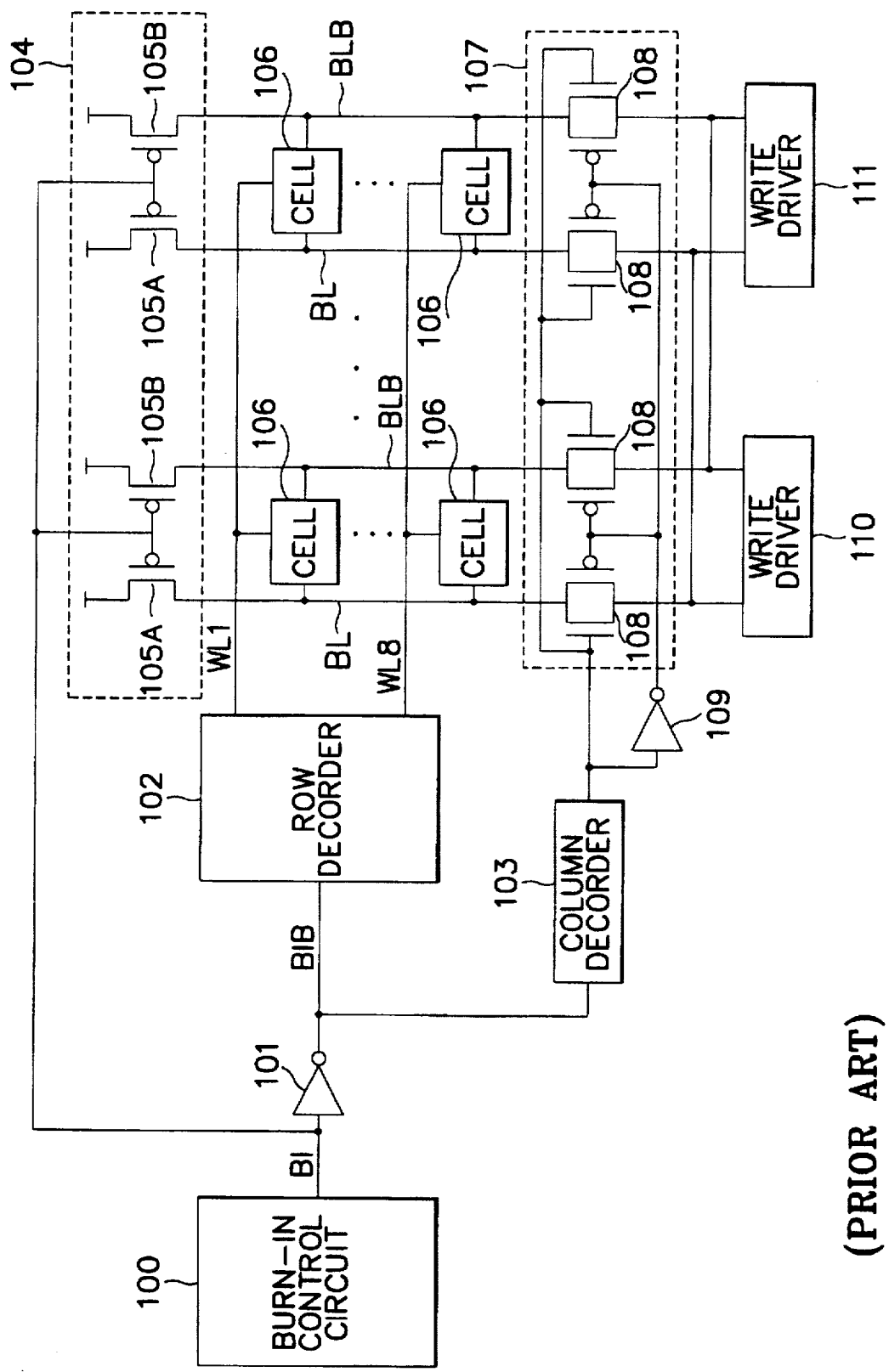
FIG. 1 is a prior art schematic circuit diagram of a prior art burn-in test circuit used for testing memory cells in a conventional semiconductor memory device.
Figure 2:
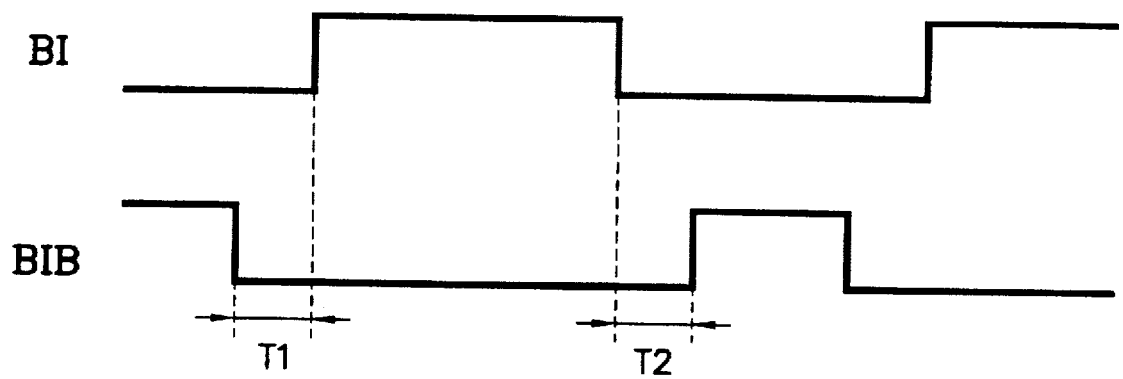
FIG. 2 is a timing diagram of burn-in control signals generated by the circuit shown in FIG. 1.
Figure 4:
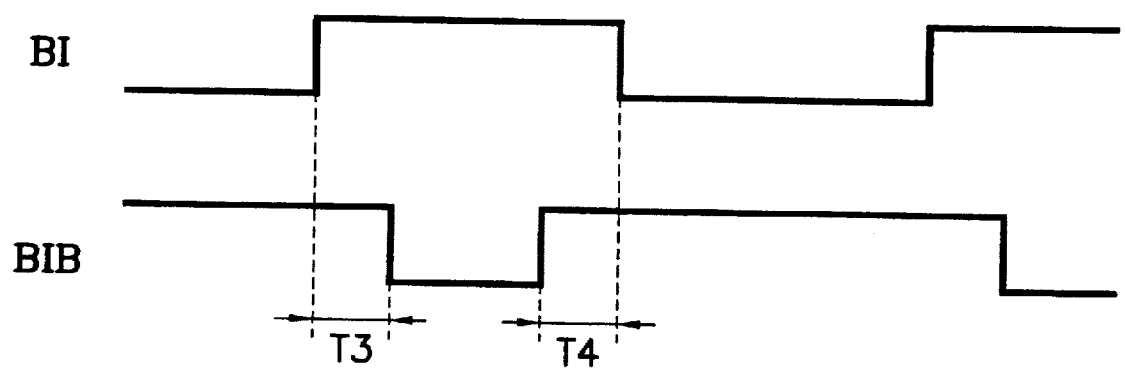
FIG. 4 is a timing diagram of control signals generated by the burn-in test circuit shown in FIG. 3.

FIG. 4 is a timing diagram showing the burn-in control signals generated by the control circuit 120 according to the present invention. Referring to FIGS. 3 and 4, the burn-in control signal BI' output from the first controller is changed from a logic "low" level to a logic "high" level. The normal mode (BI'=logic "low" signal) changes to the burn-in mode (BI'=logic "high" signal) and the burn-in control signal BI' is transmitted without a delay to the precharge circuit 104. The transmitted burn-in control signal BI' causes the clamp transistors 105A and 105B within the precharge circuit 104 to turn "off". Conversely, the complementary burn-in control signal BIB which changes the row signals WL1~WL8 and the column signal Y from the normal mode to the burn-in mode, is transmitted through the second delay circuit 114. The row signals WL1~WL8 and the column signal Y are delayed when changing to the burn-in mode. Since the row signal and column signal are only enabled for burn-in mode after the clamp transistors 105A and 105B are shut off, overcurrent paths are prevented from being formed.

If the memory device is switched from the burn-in mode to the normal mode, the burn-in control signal BI' changes from the logic "high" level to the logic "low" level. Accordingly, the complementary burn-in control signal BIB changes logic level independently of the delay circuit 114. Thus, the complementary burn-in control signal BIB immediately changes the row signals WL1~WL8 or the column signal Y to the normal mode. The burn-in control signal BI', however, is delayed by the first "On", delay circuit 113 before the clamp transistors 105A and 105B are turned.

The clamp transistors 105A and 105B are turned "off" during the burn-in mode while the row signals or the column signals are continuously selected or simultaneously enabled. The clamp transistors 105A and 105B are turned "on" during the normal mode, and only one of the row signals or the column signals is selected.

The predetermined intervals T3 and T4 created by the control circuit 120 prevent the continuous or simultaneously enabled row and column signals from generating overcurrent conditions since the precharge circuit 104 converts from normal mode to burn-in mode before the column and row signals are enabled and converts back to normal mode after the column and row signals have already converted back to normal mode.

As set forth in the foregoing, the present invention provides a burn-in test system that prevents undesirable overcurrent conditions.

While the present invention has been described above with reference to the preferred embodiment, it will be appreciated by those skilled in the art that various substitutions and modifications can be made without departing from the spirit and scope of the invention as set forth in the following claims.

What is claimed is:

1. A method for conducting a burn-in test in a semiconductor memory device having multiple cells, a precharge circuit and cell control circuitry, comprising:

operating the semiconductor memory device in both a normal mode and a burn-in test mode;

generating a first signal that switches the percentage circuit between the burn-in test mode and the normal mode;

generating a second signal that switches the cell control circuitry between the burn-in test mode and the normal mode;

delaying the second signal so that the precharge circuitry changes from the normal mode to the burn-in test mode before the cell control circuit switches from the normal mode to the burn-in test mode; and delaying the first signal so that the cell control circuitry switches from the burn-in test mode to the normal mode before the precharge circuit switches from the burn-in test mode to the normal mode.

2. A method according to claim 1 wherein the first and second signals are complementary.

3. A method according to claim 1 wherein delaying the first and second signals comprises the following steps:

identifying transitions in the first and second signals between a first logical state and a second logical state; and delaying transitions in the first signal only during transitions from the first logical state to the second logical state and delaying transitions in the second signal only during transitions from the second logical state to the first logical state.

4. A method according to claim 1 wherein the first signal turns on transistors in the precharge circuit during the normal mode and turns off the transistors during the burn-in test mode to prevent overcurrent conditions.

5. A method according to claim 4 wherein the cell control circuitry comprises multiple row and column signals for activating the cells, the second signal selecting two or more row or column signals at the same time while in the burn-in test mode.

6. A semiconductor memory device operating in both a normal mode and a test mode, comprising:

a plurality of cells for storing data;

a precharge circuit coupled to the plurality of cells;

a burn-in control circuit for applying an output signal for testing the cells;

a first controller connected between said burn-in control circuit and the precharge circuit for generating a test signal in response to the complementary of the output signal from the burn-in control circuit;

a second controller connected between the burn-in control circuit and the plurality of cells for generating a select signal that selects the cells in response to the output signal from the burn-in control circuit;

a first delay circuit coupled to the first controller for delaying the complementary of the output signal so that the cells switch from the test mode to the normal mode before the precharge circuit switches from the test mode to the normal mode; and a second delay circuit coupled to the second controller for delaying the output signal so that the precharge circuit changes from the normal mode to the test mode before the plurality of cells switch from the normal mode to the test mode.

7. A semiconductor memory device according to claim 6 including the following:

a plurality of bit line pairs connected to the cells;

a plurality of word lines connected to the cells; and a decoder circuit connected to each of the bit line pairs and to each of the word lines for applying the select signal to the plurality of cells, the select signal enabling multiple bit line pairs or word lines at the same time.

8. The semiconductor memory device according to claim 6, wherein the test signal is a complementary signal to the select signal.

9. A semiconductor memory device operating in both a normal mode and a test mode, comprising:

a plurality of cells for storing data;

a precharge circuit coupled to the plurality of cells;

a burn-in control circuit for applying an output signal for testing the cells; a first controller connected between said burn-in control circuit and the precharge circuit for generating a test signal in response to the complementary of the output signal from the burn-in control circuit, the first controller comprising a NAND gate having a first input coupled through an inverter to the burn-in control circuit and a second input coupled through a signal delay circuit and the inverter to the burn-in control circuit; and a second controller connected between the burn-in control circuit and the plurality of cells for generating a select signal that selects the cells in response to the output signal from the burn-in control circuit.

10. The semiconductor memory device according to claim 9, wherein the second controller comprises another NAND gate having a first input coupled to the burn-in control circuit and a second input coupled through a signal delay circuit to the burn-in control circuit.

11. A semiconductor memory device operating in both a normal mode and a test mode, comprising:

a plurality of cells for storing data;

a precharge circuit coupled to the plurality of cells;

a burn-in control circuit for applying an output signal for testing the cells;

a first controller connected between said burn-in control circuit and the precharge circuit for generating a test signal in response to the complementary of the output signal from the burn-in control circuit;

a second controller connected between the burn-in control circuit and the plurality of cells for generating a select signal that selects the cells in response to the output signal from the burn-in control circuit;

a first delay circuit coupled to the first controller for delaying the complementary of the output signal; and a second delay circuit coupled to the second controller for delaying the output signal.

* * * * *